United States Patent
Garcia et al.

(10) Patent No.: US 10,512,043 B2
(45) Date of Patent: Dec. 17, 2019

(54) METHODS AND APPARATUSES FOR RECEIVING IN A WIRELESS COMMUNICATION SYSTEM

(71) Applicant: TELEFONAKTIEBOLAGET LM ERICSSON (PUBL), Stockholm (SE)

(72) Inventors: Virgile Garcia, Beijing (CN); Ming Li, Beijing (CN); Qingyu Miao, Beijing (CN); Jianfeng Wang, Beijing (CN)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 47 days.

(21) Appl. No.: 15/513,828

(22) PCT Filed: Feb. 21, 2017

(86) PCT No.: PCT/CN2017/074304
§ 371 (c)(1),
(2) Date: Mar. 23, 2017

(87) PCT Pub. No.: WO2018/152680
PCT Pub. Date: Aug. 30, 2018

(65) Prior Publication Data
US 2018/0249423 A1      Aug. 30, 2018

(51) Int. Cl.
*H04W 52/22* (2009.01)
*H03G 3/30* (2006.01)
*H04B 1/04* (2006.01)
*H04B 7/06* (2006.01)
*H04W 72/12* (2009.01)

(52) U.S. Cl.
CPC ........ *H04W 52/223* (2013.01); *H03G 3/3042* (2013.01); *H04B 1/04* (2013.01); *H04B 7/0617* (2013.01); *H04W 72/1263* (2013.01); *H04B 2001/0416* (2013.01)

(58) Field of Classification Search
CPC combination set(s) only.
See application file for complete search history.

(56) References Cited

U.S. PATENT DOCUMENTS 9,478,857 B2 * 10/2016 Chang .................... H01Q 1/246
2008/0031387 A1    2/2008 Shin et al.
(Continued)

FOREIGN PATENT DOCUMENTS

CN            102447502 A        5/2012

OTHER PUBLICATIONS

International Search Report and Written Opinion issued in Application No. PCT/CN2017/074304 dated Nov. 10, 2017, 9 pages.
(Continued)

*Primary Examiner* — Junpeng Chen
(74) *Attorney, Agent, or Firm* — Rothwell, Figg, Ernst & Manbeck, P.C.

(57) ABSTRACT

Embodiments of the present disclosure provide methods, apparatuses and computer program in a receiving device. A method comprises obtaining a beamforming (BF) parameter associated with a signal to be received; scheduling an automatic gain control (AGC) operation based on the BF parameter; and applying the AGC operation on the signal according to the scheduling. Embodiments of the present disclosure may increase accuracy of AGC control and reduce/avoid performance degradation caused by reaction delay of AGC.

25 Claims, 7 Drawing Sheets

(56) References Cited

U.S. PATENT DOCUMENTS

| | | | | |
|---|---|---|---|---|
| 2008/0240031 A1* | 10/2008 | Nassiri-Toussi | ..... | H04B 7/0408 370/329 |
| 2010/0142661 A1* | 6/2010 | Lee | ..... | H03G 3/3052 375/345 |
| 2014/0211891 A1 | 7/2014 | Park et al. | | |
| 2014/0307654 A1* | 10/2014 | Kim | ..... | H04B 7/0617 370/329 |

OTHER PUBLICATIONS

Ericsson: "Multi-antenna transmission principles for data channels in NR", 3GPP; TSG-RAN WG1, Meeting #86, R1-167465, Discussion and Decision, Aug. 22-26, 2016, Göteborg, Sweden, 3 pages.

* cited by examiner

METHODS AND APPARATUSES FOR RECEIVING IN A WIRELESS COMMUNICATION SYSTEM

CROSS REFERENCE TO RELATED APPLICATION(S)

This application is a 35 U.S.C. § 371 National Stage of International Patent Application No. PCT/CN2017/074304, filed Feb. 21, 2017, designating the United States, the disclosure of which is incorporated by reference.

TECHNICAL FIELD

The non-limiting and example embodiments of the present disclosure generally relate to a technical field of wireless communication, and specifically to methods, apparatuses and computer programs for receiving signals in a wireless communication system.

BACKGROUND

This section introduces aspects that may facilitate a better understanding of the disclosure. Accordingly, the statements of this section are to be read in this light and are not to be understood as admissions about what is in the prior art or what is not in the prior art.

In wireless systems, there is a requirement for high throughput, and future wireless networks are being designed with a target data rate of several Gbps. To reach such high bit rates, a solution exploiting a large number of antennas, referred to as massive multiple input multiple output (MIMO) has been considered in some communication systems. Though massive MIMO was originally envisioned for use in a time division duplex (TDD) system, but it can potentially be applied also in a frequency division duplex (FDD) system.

Massive MIMO makes a clean break with current practice through use of a large number of serving antennas that are operated coherently and adaptively. The use of the large number of antennas facilitates focusing signal energy into a small region in space. As a result, massive MIMO brings huge improvements in throughput and energy efficiency, in particular when it is combined with simultaneous scheduling of a large number (e.g., tens or hundreds) of terminals.

Other benefits of massive MIMO include an extensive use of inexpensive low-power components, reduced latency, simplification of the media access control (MAC) layer, and robustness to interference and intentional jamming. Anticipated throughput of a massive MIMO system depends on propagation environment providing asymptotically orthogonal channels to terminals, and no limitation in this regard has been disclosed by experiments so far.

While massive MIMO renders many traditional research problems irrelevant, it uncovers entirely new problems.

SUMMARY

In addition to other problems, massive MIMO also brings challenges to a receiving device which may be a network device or a terminal device. For example, how to set the Automatic Gain Control (AGC) of the receiving device in an efficient way is still an open problem. In order to solve at least part of problems in a conventional receiving device, new method and apparatus are desired. To this end, methods, apparatuses and computer programs are provided in the present disclosure. It will be appreciated that embodiments of the present disclosure are not limited to a massive MIMO system, but could be more widely applied to any wireless communication system where similar problems exist.

Various embodiments of the present disclosure mainly aim at providing methods, apparatuses and computer programs implemented in a receiving device. Other features and advantages of embodiments of the present disclosure will be understood from the following description of specific embodiments when read in conjunction with the accompanying drawings, which illustrate, by way of example, the principles of embodiments of the present disclosure.

In a first aspect of the disclosure, there is provided a method implemented in a receiving device. The method comprises: obtaining a beamforming (BF) parameter associated with a signal to be received; scheduling an automatic gain control, AGC, operation based on the BF parameter, and applying the AGC operation on the signal according to the scheduling. In an embodiment, the BF parameter may include one or more of: an index of a beam, a BF weight associated with a beam, and BF gain associated with a beam.

In some embodiments, the receiving device may schedule the AGC operation based on the BF parameter by: obtaining a predicted receiving power of the signal based on the BF parameter, and scheduling the AGC operation based on the predicted receiving power.

In another embodiment, the receiving device may schedule the AGC operation based on the BF parameter by: determining an AGC gain associated with the BF parameter; and scheduling the AGC operation based on the determined AGC gain. In an embodiment, the network device may determine the AGC gain associated with the BF parameter based on a predetermined mapping between a BF parameter and an AGC gain.

In a further embodiment, the method may comprise generating the predetermined mapping between a BF parameter and an AGC gain based on a historical/previous value of AGC gain associated with the BF parameter.

In another embodiment, the method may comprise updating the predetermined mapping between a BF parameter and an AGC gain based on one or more of: a measurement on receiving power of the signal, scheduling information related to a beam, scheduling information related to a transmitter, and mobility of a transmitter.

In still another embodiment, the method may further comprise scheduling a receiving beam for a signal based on a corresponding AGC gain. In an embodiment, scheduling a receiving beam based on a corresponding AGC gain may include scheduling a plurality of receiving beams associated with an AGC gain in a plurality of contiguous time intervals respectively.

In some embodiments, the method may further comprise scheduling a plurality of receiving beams for the plurality of RF chains jointly.

In another embodiment, the receiving device may apply the AGC operation on the signal according to the scheduling by applying the AGC operation synchronously with application of the BF parameter on the signal.

In a second aspect of the disclosure, there is provided a receiving device. The receiving device may include a BF parameter obtaining unit, an AGC scheduling unit, and an AGC operating unit. The BF parameter obtaining unit is configured to obtain a BF parameter associated with a signal to be received, the AGC scheduling unit is configured to schedule an AGC operation based on the BF parameter, and the AGC operating unit is configured to apply the AGC operation on the signal according to the scheduling.

In a third aspect of the disclosure, there is provided a receiving device. The receiving device includes a processor and a memory, said memory contains instructions executable by said processor, and said processor is configured to cause the receiving device to perform a method according the first aspect of the present disclosure.

In a fourth aspect of the disclosure, there is provided a computer program, comprising instructions which, when executed on one or more processors, cause the one or more processors to carry out a method according to the first aspect of the present disclosure.

In a fifth aspect of the disclosure, there is provided an apparatus in a receiving device, the apparatus comprises processing means adapted to perform a method according the first aspect of the present disclosure.

According to various aspects and embodiments as mentioned above, the AGC of a receiving device may be set in an efficient way, and performance of signal receiving may be improved.

BRIEF DESCRIPTION OF THE DRAWINGS

The above and other aspects, features, and benefits of various embodiments of the present disclosure will become more fully apparent from the following detailed description with reference to the accompanying drawings, in which like reference numerals or letters are used to designate like or equivalent elements. The drawings are illustrated for facilitating better understanding of the embodiments of the disclosure and not necessarily drawn to scale, in which.

DETAILED DESCRIPTION

Figure 1:
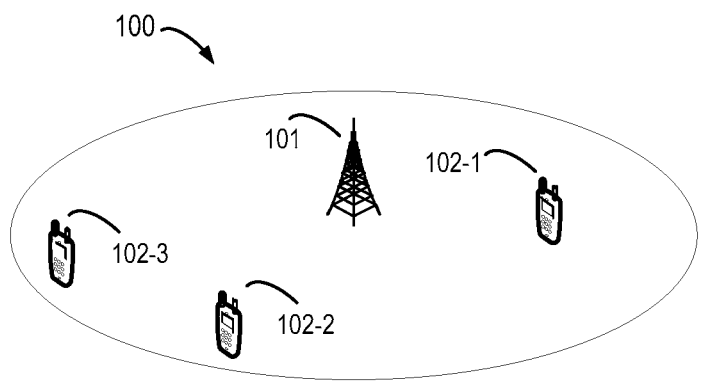
FIG. 1 illustrates an example wireless communication network in which embodiments of the present disclosure may be implemented.

Hereinafter, the principle and spirit of the present disclosure will be described with reference to illustrative embodiments. It should be understood, all these embodiments are given merely for one skilled in the art to better understand and further practice the present disclosure, but not for limiting the scope of the present disclosure. For example, features illustrated or described as part of one embodiment may be used with another embodiment to yield still a further embodiment. In the interest of clarity, not all features of an actual implementation are described in this specification.

References in the specification to "one embodiment," "an embodiment," "an example embodiment," and the like indicate that the embodiment described may include a particular feature, structure, or characteristic, but it is not necessary that every embodiment includes the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It shall be understood that although the terms "first" and "second" etc. may be used herein to describe various elements, these elements should not be limited by these terms. These terms are only used to distinguish one element from another. For example, a first element could be termed a second element, and similarly, a second element could be termed a first element, without departing from the scope of example embodiments. As used herein, the term "and/or" includes any and all combinations of one or more of the associated listed terms.

The terminology used herein is for the purpose of describing particular embodiments only and is not intended to be liming of example embodiments. As used herein, the singular forms "a", "an" and "the" are intended to include the plural forms as well, unless the context clearly indicates otherwise. It will be further understood that the terms "comprises", "comprising", "has", "having", "includes" and/or "including", when used herein, specify the presence of stated features, elements, and/or components etc., but do not preclude the presence or addition of one or more other features, elements, components and/or combinations thereof.

In the following description and claims, unless defined otherwise, all technical and scientific terms used herein have the same meaning as commonly understood by one of ordinary skills in the art to which this disclosure belongs.

As used herein, the term "wireless communication network" refers to a network following any suitable wireless communication standards, such as LTE-Advanced (LTE-A), LTE, Wideband Code Division Multiple Access (WCDMA), High-Speed Packet Access (HSPA), and so on. Furthermore, the communications between network devices in the wireless communication network may be performed according to any suitable generation communication protocols, including, but not limited to, the first generation (1G), the second generation (2G), 2.5G, 2.75G, the third generation (3G), the fourth generation (4G), 4.5G, the fifth generation (5G) communication protocols, and/or any other protocols either currently known or to be developed in the future.

As used herein, the term "network device" refers to a device in a wireless communication network via which a terminal device accesses the network and receives services therefrom. The network device may refer to a base station (BS) or an access point (AP), for example, a node B (NodeB or NB), an evolved NodeB (eNodeB or eNB), a Remote Radio Unit (RRU), a radio header (RH), a remote radio head (RRH), a relay, a low power node such as a femto, a pico, and so forth, depending on the applied terminology and technology.

Yet further examples of network device include multi-standard radio (MSR) radio equipment such as MSR BSs, network controllers such as radio network controllers (RNCs) or base station controllers (BSCs), base transceiver stations (BTSs), transmission points, transmission nodes, Multi-cell/multicast Coordination Entities (MCEs), core network nodes (e.g., MSCs, MMEs), O&M nodes, OSS nodes, SON nodes, positioning nodes (e.g., E-SMLCs), and/or MDTs. More generally, however, network device may represent any suitable device (or group of devices) capable, configured, arranged, and/or operable to enable and/or provide a terminal device access to the wireless communication network or to provide some service to a terminal device that has accessed the wireless communication network.

The term "terminal device" refers to any end device that can access a wireless communication network and receive services therefrom. By way of example and not limitation, a terminal device may be referred to as user equipment (UE), a Subscriber Station (SS), a Portable Subscriber Station, a Mobile Station (MS), or an Access Terminal (AT). The terminal device may include, but not limited to, a mobile phone, a cellular phone, a smart phone, a tablet, a wearable device, a personal digital assistant (PDA), portable computers, image capture terminal devices such as digital cameras, gaming terminal devices, music storage and playback appliances, wearable terminal devices, vehicle-mounted wireless terminal devices and the like. In the following description, the terms "terminal device", "terminal", "user equipment" and "UE" may be used interchangeably.

As one specific example, a terminal device may represent a UE configured for communication in accordance with one or more communication standards promulgated by the 3rd Generation Partnership Project (3GPP), such as 3GPP's GSM, UMTS, LTE, and/or 5G standards. As used herein, a "user equipment" or "UE" may not necessarily have a "user" in the sense of a human user who owns and/or operates the relevant device. Instead, a UE may represent a device that is intended for sale to, or operation by, a human user but that may not initially be associated with a specific human user.

The terminal device may support device-to-device (D2D) communication, for example by implementing a 3GPP standard for side-link communication, and may in this case be referred to as a D2D communication device.

As yet another specific example, in an Internet of Things (IOT) scenario, a terminal device may represent a machine or other device that performs monitoring and/or measurements, and transmits the results of such monitoring and/or measurements to another terminal device and/or network equipment. The terminal device may in this case be a machine-to-machine (M2M) device, which may in a 3GPP context be referred to as a machine-type communication (MTC) device. As one particular example, the terminal device may be a UE implementing the 3GPP narrow band internet of things (NB-IoT) standard. Particular examples of such machines or devices are sensors, metering devices such as power meters, industrial machinery, or home or personal appliances, e.g. refrigerators, televisions, personal wearables such as watches etc. In other scenarios, a terminal device may represent a vehicle or other equipment that is capable of monitoring and/or reporting on its operational status or other functions associated with its operation.

The term "receiving device" refers to any network device or terminal device which is capable of receiving a signal from another device. In present disclosure, the terms "receiving device" and "receiver" may be used interchangeably. Likewise, a "transmitting device" refers to any network device or terminal device that transmits a signal to another device, and the terms "transmitting device" and "transmitter" may be used interchangeably herein. For example, during an uplink (UL) transmission, a network device (e.g., an eNB) acts as a receiving device and a terminal device acts as a transmitting device, while during a downlink (DL) transmission, the network device acts as a transmitting device and the terminal device acts as a receiving device. As used herein, a DL transmission refers to a transmission from the network device to a terminal device, and an UL transmission refers to a transmission in an opposite direction.

FIG. 1 illustrates an example wireless communication network 100 in which embodiments of the disclosure may be implemented. As shown in FIG. 1, the wireless communication network 100 may include one or more network devices, for example network devices 101, which may be in a form of an eNB. It will be appreciated that the network device 101 could also be in a form of a Node B, BTS (Base Transceiver Station), and/or BSS (Base Station Subsystem), access point (AP) and the like. The network device 101 may provide radio connectivity to a set of terminal devices or UEs 102-1, 102-2 . . . 102-N (collectively referred to as "terminal device(s) 102) within its coverage, where N is an integer.

To increase throughput, the network device 101 and/or the terminal device(s) 102 may be equipped with a plurality of antennas, and in some wireless systems (e.g., a massive MIMO system), the number of antennas at the network device side (and/or the terminal device side) may be increased significantly, e.g., to an order of hundreds.

A large number of antennas can provide large signal processing gains and render many traditional research problems irrelevant, and at the same time, it uncovers entirely new problems. For example, it brings challenges in making many low-cost and low-precision components work effectively together, efficient acquisition of channel state information, resource allocation for newly-joined terminals, exploiting extra degrees of freedom provided by the large number of serving antennas, reducing internal power consumption to achieve total energy efficiency reductions, and finding new deployment scenarios.

In addition, massive MIMO also brings challenges to a receiving device. For example, how to set the Automatic Gain Control (AGC) at the receiving device in an efficient way is still an open problem, especially when beam sweeping is utilized at the receiving device (also referred to as a receiver).

Figure 2:
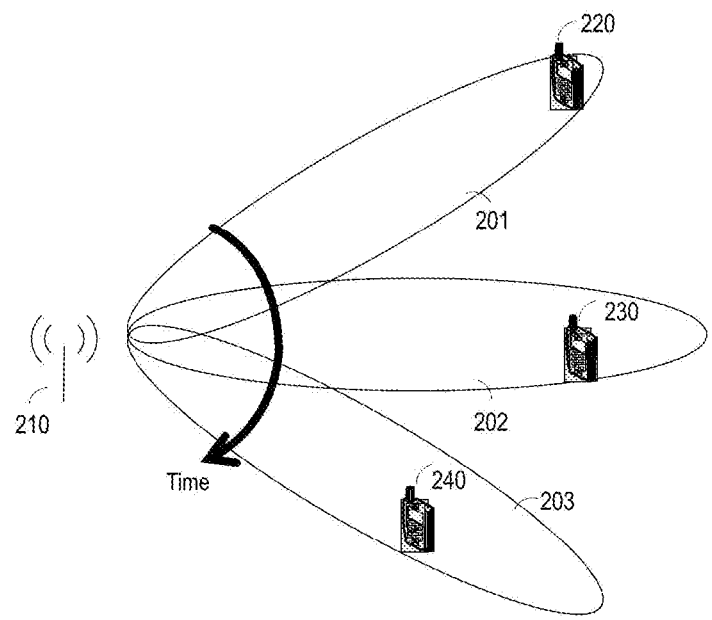
FIG. 2 illustrates schematically an example of beam sweeping.

Beam sweeping is a method used at the receiver to scan a desired coverage area with beams in all directions. Such an operation may be needed, for example, when location of a transmitting device (e.g., a user equipment) is not known correctly, such as during a random access procedure. Massive MIMO BF has an advantage of providing large antenna gains in a direction, but the beam tends to be very narrow. Therefore, to make sure that a desired area is well covered (that is, signals from transmitters at various positions within the desired area can be received), the antennas have to be configured to sweep all the beam directions available. An example of beam sweeping is schematically illustrated in FIG. 2. In this example, a base station 210 sweeps the three beams 201-203 to receive signals from the terminal devices 220-240.

Figure 3:
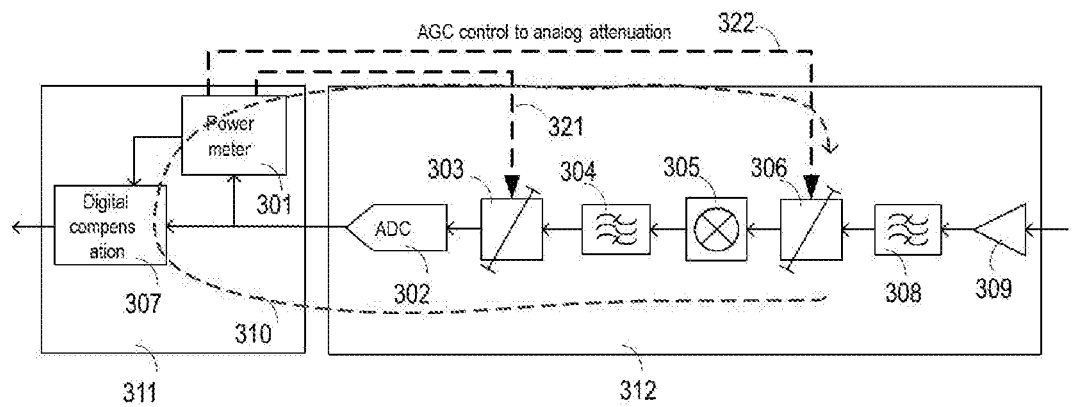
FIG. 3 illustrates a block diagram of an example implementation of conventional AGC.

The AGC is an important function implemented in the receiving device, and is used to ensure that a signal received by the receiver is processed at a suitable signal power level (also referred to as a signal power or a signal lever). For example, the AGC gain for a received signal may be adjusted in response to a high power level of the received signal. A block diagram of an example implementation of a conventional AGC is depicted in FIG. 3. In FIG. 3, the modules involved in a dashed circle 310 form a 'AGC loop' which includes: 1) a digital power meter 301 for determining received signal power level; 2) one or more triggers (not shown) with the value(s) referring to pre-defined power level thresholds for the controllable attenuators 303 and 306; and 3) a relative digital power compensation module 307 to keep uniform receiver gain. As shown in FIG. 3, the power meter 301 may provide an output to more than one attenuators (303, 306) to enable a multiple-stage gain control. The AGC loop 310 may also include one or more other elements, for example, an Analog to Digital Converter (ADC) 302, a filter 304, and a frequency shifter 305. Before entering the AGC loop, a received signal may be preprocessed using an amplifier 309 and a filter 308. It should be appreciated that in some implementations, additional or alternative preprocessing may be used based on needs.

Figure 4:
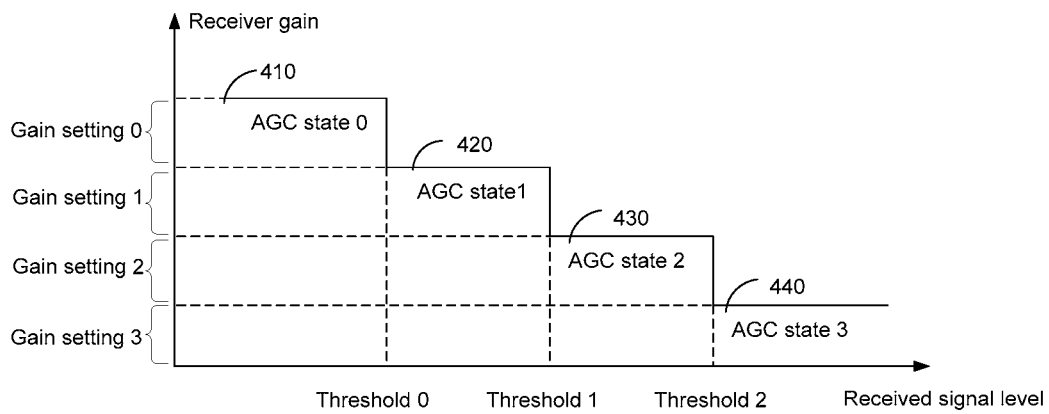
FIG. 4 illustrates a typical AGC attenuation configuration.

An AGC attenuation configuration indicates one or more received power levels for triggering one or more AGC states respectively and AGC gains corresponding to the one or more AGC states. FIG. 4 shows a typical AGC attenuation configuration where four AGC states (410-440) each corresponding to a gain setting are illustrated as an example. The purpose of introducing more than one AGC states is to reduce granularity of the attenuation so as to achieve a finer control of the AGC gain and mitigate degradation of the sensitivity due to the high attenuation.

As already shown in the example of FIG. 3, the AGC gain is determined based on a feed-back mechanism, and as a result, it takes extra reaction time to update setting of the AGC gain at the receiver. The reaction time occupies normal receiving time period and it may cause mismatching between the AGC gain and the received signal power, especially in a massive MIMO system with beam sweeping.

Figure 5:
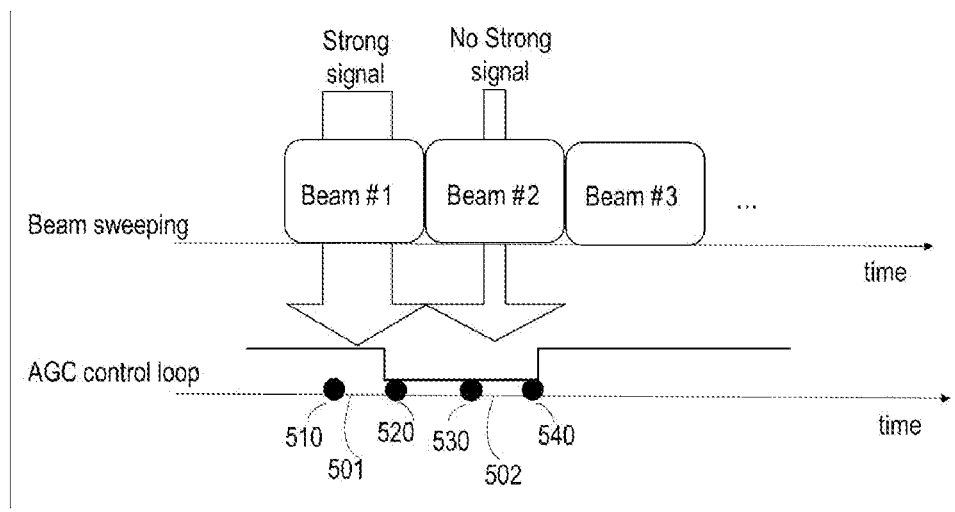
FIG. 5 illustrates schematically an example of mismatching between receiving signal power and AGC gain in a massive MIMO system.

An example of the mismatching problem in a massive MIMO system is shown in FIG. 5. However, it should be appreciated that similar problem may exist in a non-MIMO system. In this example, it is assumed that there is a time interval (501, 502) reserved for adjusting AGC gain by selecting a proper value based on the received signal power. On the other hand, in a massive MIMO system, it may be necessary to sweep or switch among the beams frequently, for example according to a scheduler in the receiver. A difference between the massive MIMO system and a conventional wireless communication system is that much higher BF gain may be obtained for a beam, which may result in a much higher receiving signal power for the beam. Therefore, the beam sweeping/switching among a plurality of narrow beams may result in a significant change in receiving signal power in a short time duration, for example due to strong signal power being detected in one receiving beam while only a weak signal power being detected in another receiving beam. Note that both a desired signal and an interfering signal contribute to the signal power being detected in a receiving beam, and the interfering signal may include, but is not limited to, a signal from a neighbor cell, an out-of-band signal, a hardware generated interference (due to mismatch, coupling . . . ) and the like.

As shown in FIG. 5, in this example, strong signal power is detected using a receiving Beam #1. Correspondingly, an AGC adjustment is triggered at 510 in response to detecting a high signal power level (for example caused by a strong desired signal or a strong interfering signal). After a delay 501, a new gain output from the AGC adjustment is applied at 520. As shown in FIG. 5, in a following time slot, Beam #2 with possibly different BF gain is applied, and no strong signal power is detected at 530. After a delay 502, a further new AGC gain is applied at 540. As shown in FIG. 5, the AGC gain is applied with a delay and it causes a mismatch between the beam switching and the AGC adjustment, and correspondingly a mismatch between the received signal power and the AGC gain. The mismatch due to loop time may degrade the receiving performance significantly. It can be observed from the example in FIG. 5 that if a conventional AGC solution as shown in FIG. 3 is utilized jointly with fast beam-switching (e.g. beam sweeping), the issue caused by reaction time will bring negative impact to the performance, for example receiving performance with Beam#2 in FIG. 5 will be degraded due to too low AGC gain even if there is no interference.

It should be appreciated that in another scenario, frequent change in receiving signal power may not necessarily be caused by interfering signal or beam sweeping; however, the frequent change may result in similar problem of mismatch between the received signal power and the AGC gain.

In order to solve at least part of the above and possibly problems, methods, apparatuses and computer programs have been proposed herein. Some embodiments of the present disclosure provide an enhancement to the AGC operation to improve receiving performance.

Figure 6A:
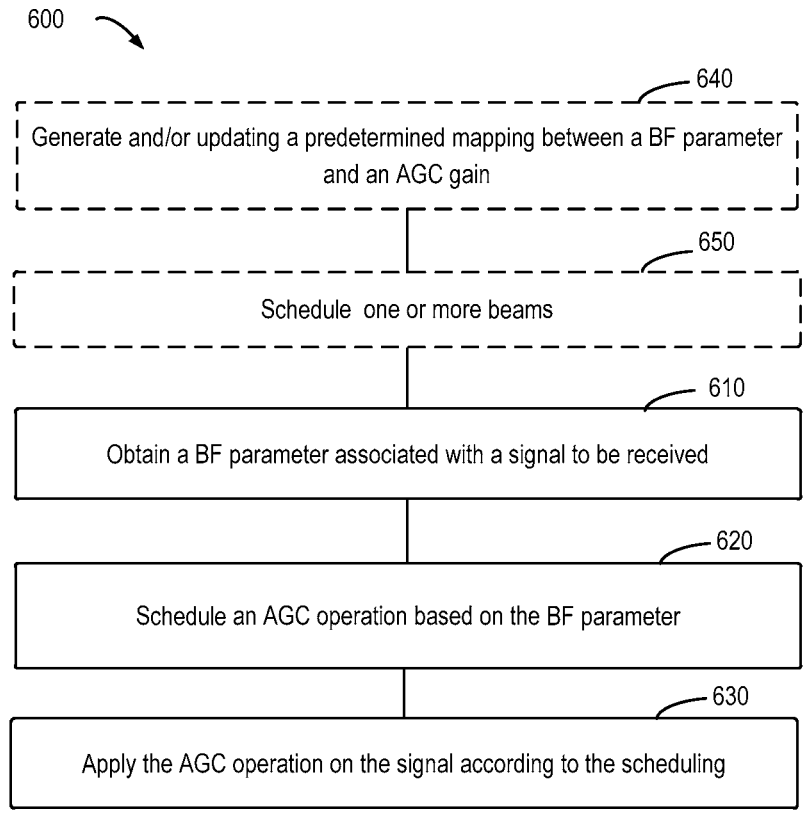
FIGS. 6A-6E illustrate flowcharts of methods in a receiving device according to embodiments of the present disclosure.

Reference is now made to FIG. 6A which shows a flowchart of a method 600 in a receiving device according to an embodiment of the present disclosure, and the receiving device may be a network device (e.g., eNB 101 shown in FIG. 1) or a terminal device (e.g., the UE 102 shown in FIG. 1). For ease of discussions, the method 600 will be described below with reference to the network device 101 and the environment as described with reference to FIG. 1.

As illustrated in FIG. 6A, at block 610, the network device 101 obtains a BF parameter associated with a signal to be received. For illustration rather than limitation, the BF parameter may include one or more of: an index of a beam, a BF weight associated with a beam, and BF gain associated with a beam.

In an embodiment, at block 610, an AGC control unit of the network device 101 may obtain the BF parameter from a scheduling unit which may be included in a baseband unit of the network device 101. A new message including the BF parameter may be transmitted from the baseband unit to the AGC control unit of the network device 101, for example via a baseband unit to digital unit (BU-DU) link, such as a Common Public Radio Interface (CPRI) link. However, embodiments of the present disclosure are not limited to implementing the operation of block 610 using any specific unit/link/interface/technique. The BF parameter used for receiving a signal will be determined (for example by the scheduling unit) prior to arrival of the signal so that proper BF parameter (e.g., BF weight) can be applied on demand, and therefore the network device 101 is able to obtain the BF parameter in advance and use it to facilitate an operation of the AGC control unit.

As shown in FIG. 6A, at block 620, the network device 101 schedules an AGC operation based on the BF parameter obtained at block 610. The operation of block 620 connects the beam scheduling with the AGC scheduling, and enables to predict a proper AGC operation for the signal to be received. Compared with the conventional AGC mechanism shown in FIG. 3 which adjusts the AGC gain based on measurement of received signals, the processing delay or reaction delay of the AGC control can be avoided or reduced, since the AGC operation may be scheduled before arrival of the signal based on information of BF parameter to be applied on the signal.

At block 620, the network device 101 may schedule the AGC operation based on the BF parameter in various ways, and some examples are provided below for illustration rather than limitation.

Figure 6B:
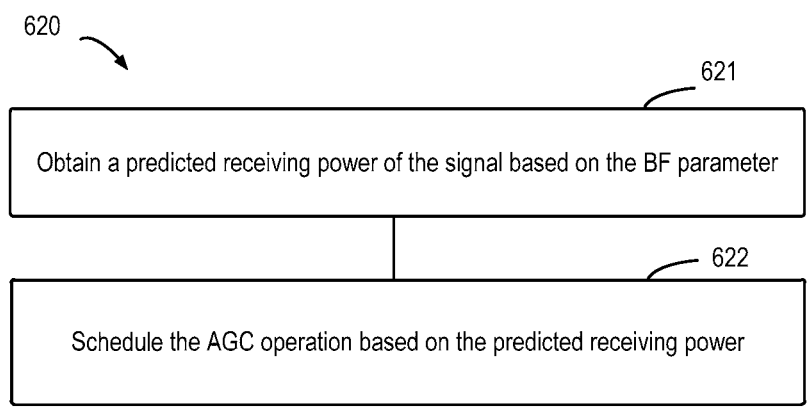

One example is show in FIG. 6B. In this example, at block 621, the network device 101 obtains a predicted receiving power of the signal based on the BF parameter obtained at block 610; and at block 622, the network device schedules the AGC operation based on the predicted receiving power. For example, the network device may determine a proper AGC gain based on the predicted receiving power and an AGC attenuation configuration as shown in FIG. 4.

Embodiments are not limited to any specific way for obtaining the predicted receiving power of the signal based on the BF parameter at block 621. As an example, the network device 101 may predict the receiving power of the signal via, for example, calculating or table lookup. As another example, the network device 101 may obtain the predicted receiving power of the signal based on a predetermined mapping (which may be, for example, stored in a format of a file or a table) between a BF parameter and a receiving power level.

Figure 6C:
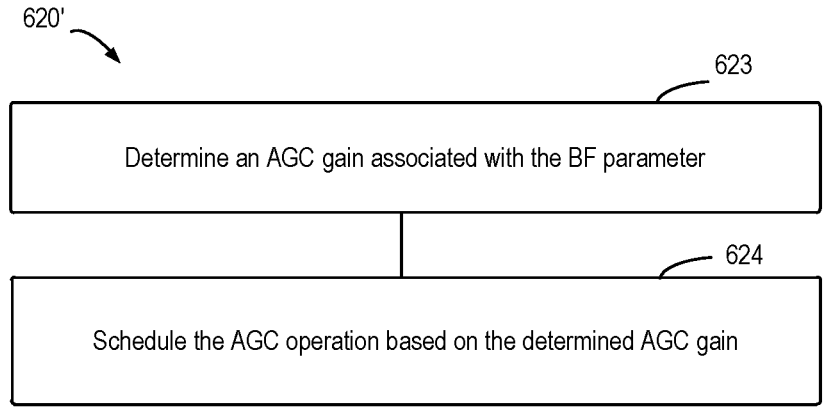

FIG. 6C illustrates an alternative example for scheduling the AGC operation based on the BF parameter. As shown in FIG. 6C, at block 623, the network device 101 determines an AGC gain associated with the BF parameter, and at block 624, the network device 101 schedules the AGC operation based on the determined AGC gain.

In an embodiment, at block 623, the network device 101 may determine the AGC gain in various ways. For example, the network device 101 may determine the AGC gain via calculating or table lookup. For illustration rather than limitation, in an embodiment, the network device 101 may determine the AGC gain based on a predetermined mapping between a BF parameter and an AGC gain. The predetermined mapping may be stored, for example, as a table or a file or a part thereof. In an embodiment, the predetermined mapping may involve one or more other parameters, for example, information related to a transmitting device. That is, the AGC gain may be indicated, in the predetermined mapping, as a function of both the BF parameter (e.g., a beam index) and the information related to a transmitter of the signal (e.g., a user equipment served by the network device 101). For example, an AGC gain may be mapped to a combination of a BF parameter and a transmitter. The information related to the transmitter may be, for example but not limited to, one or more of a user identity and a transmitting configuration such as precoding parameter, modulation and coding scheme (MCS), transmission power and the etc.

Now referring back to FIG. 6A. At block 630, the network device 101 applies the AGC operation on the signal according to the scheduling. In one embodiment, the scheduling at block 620 indicates one or more of a time resource and a frequency resource for applying the BF parameter, and at block 630, the network device 101 applies the AGC operation synchronously with application of the BF parameter on the signal. It ensures that the BF parameter and a corresponding AGC gain are applied on the signal in a substantially synchronized manner, and therefore, the mismatch problem as shown in FIG. 5 can be avoided or mitigated. In another embodiment, the scheduling at block 620 may indicate directly one or more of a time resource and a frequency resource for applying the AGC operation, and at block 630 the network device 101 may apply the AGC operation according to the indicated one or more of a time resource and a frequency resource.

Figure 6D:
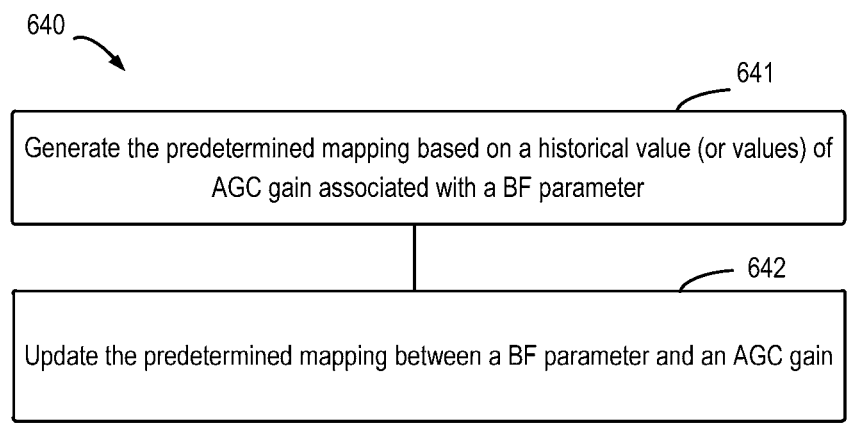

In some embodiments, the method 600 may further include a block 640 for generating and/or updating the predetermined mapping used at block 623. Example implementations of the operation 640 are shown in FIG. 6D for illustration rather than limitation. As an example, the network node 101 may generate, at block 641, the predetermined mapping based on a historical/previous value (or values) of AGC gain associated with a BF parameter. It should be appreciated that block 641 is optional and can be omitted in some embodiments where the predetermined mapping may be pre-stored and can be used by the method 600 directly.

Alternatively or in addition, in another example, at block 642, the network node 101 updates the predetermined mapping between a BF parameter and an AGC gain based on at least one of: a measurement on receiving power of the signal, scheduling information related to a beam, scheduling information related to a transmitter, and mobility of a transmitter. For example, once the actual BF parameter is applied for receiving the signal and the AGC operation is performed at block 630, a conventional AGC operation (e.g., using the mechanism shown in FIG. 3) may be performed additionally to further refine the AGC gain in order to adapt to any possible new change in receiving power or to compensate a potential error in the prediction on AGC gain or receiving power of the signal. That is, receiving power of the signal may be measured, and used to update/refine the AGC gain. Once the AGC gain is refined, the refined gain value may be used to update the predetermined mapping between the BF parameter and the AGC gain. For example, the refined AGC gain value may be reported/inputted to a unit for table/map storage and update, and the updated mapping may be used for later AGC scheduling (for example, selection of AGC gain).

In another embodiment, the predetermined mapping may be updated in response to a change in a beam. For example, if scheduling information (e.g., weight) of a beam is changed, the network device 101 may update the predetermined mapping between a beam and an AGC gain accordingly. As another example, if a transmitter (e.g., a terminal device) associated with a beam is changed due to mobility of the transmitter, and the change results in different BF gain, the network device 101 may also update the predetermined mapping between a beam (e.g., an identity of the beam) and an AGC gain, or between a BF parameter (e.g., BF weight or vector or matrix) and an AGC gain. Likewise, if scheduling information (e.g., transmission configuration) related to a transmitter is changed, and the change results in different receiving power associated with a beam, at block 642, the network device 101 may update the predetermined mapping between a beam (BF parameter) and an AGC gain.

Referring back to FIG. 6A Now. As shown in the FIG. 6A, the method 600 may further include an optional block 650 for scheduling of one or more beams, which may include determining which BF parameter is to be used in which time and/or frequency resource for receiving one or more signals. It should be appreciated that in some embodiments the scheduling operation of BF may not be included in the method 600, and the network device 101 may just obtain a result of the BF scheduling via block 610.

Figure 6E:
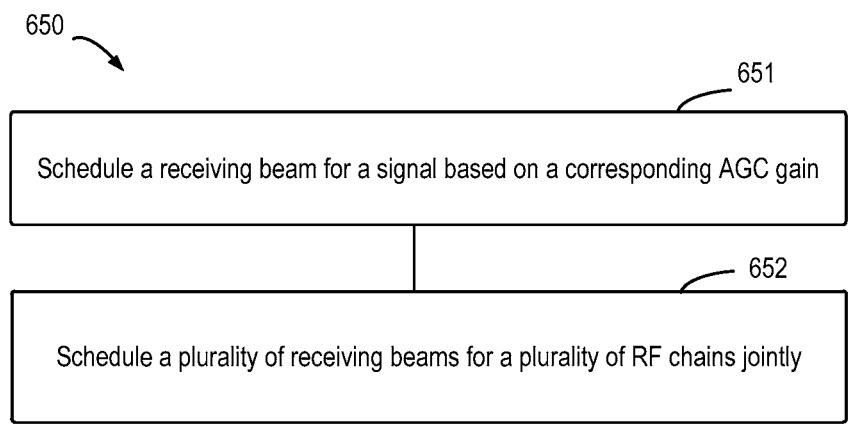

In some embodiments, the scheduling of a beam may be implemented in such a way that frequent AGC operation change/adjustment may be avoided. Examples of such implementation of block 650 are illustrated in FIG. 6E. As shown in FIG. 6E, at block 651, the network device 101 may schedule a receiving beam for a signal based on a corresponding AGC gain. For example, the network device 101 may schedule, for a time slot n, a beam associated with a GAC gain which is similar as that applied in an adjacent time slot n−1, such that no significant change in AGC gain is required in current time slot n. In another embodiment, the network device 101 may apply a plurality of receiving beams associated with an AGC gain in a plurality of contiguous time intervals respectively. It means that the receiving beams applied in the plurality of contiguous time intervals is mapped to a same AGC gain value or a plurality of similar AGC gain values. In this way, the network device 101 may schedule same/similar AGC operation(s) in the plurality of contiguous time intervals, that is, no significant change in the AGC operation will occur in the plurality of contiguous time intervals. This may reduce time and power consumption of the AGC operation.

Alternatively or in addition, in another embodiment, the receiving device, for example the network device 101, may include a plurality of parallel radio frequency (RF) chains, and at block 652, the network device 101 may schedule a plurality of receiving beams for the plurality of RF chains jointly to avoid frequent adjustment of an AGC operation. That is, the network device 101 may determine which beam is to be applied in which RF chain and in which time and/or frequency resource for receiving a signal. By joint scheduling of beams and AGC values across the plurality of RF chains, adjustment of the AGC operation may be simplified and performance degradation may be reduced or avoided. Alternatively, in another embodiment, the network device 101 may schedule a plurality of receiving beams for the plurality of RF chains separately or independently for simplicity of the BF scheduling.

In some embodiments of the present disclosure, by utilizing the predicted BF gain in the AGC scheduling, at least some of the following advantages may be achieved:
  Faster convergence of the AGC loop;
  Avoidance of data loss due to saturation, for example, when these data are transmitted in short time duration, such as during a physical random access channel (PRACH) or beam sweeping procedure.
  AGC gains can be aligned with the received signal power, since the beam selection is known in advance and the AGC is scheduled based on beam selection;
  Time consuming in the radio unit can be reduced;
  Cost of the AGC control unit can be reduced.

Figure 7A:
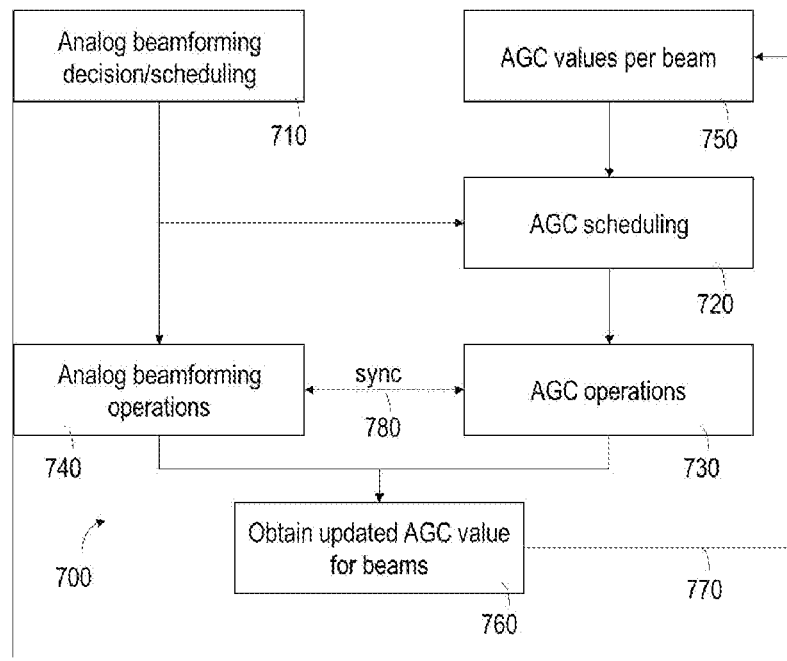
FIG. 7A illustrates a flowchart of another method in a receiving device according to an embodiment of the present disclosure.

In FIG. 7A, a flow chart of another example method 700 implemented in a receiving device according to an embodiment of the present disclosure is illustrated. The receiving device may be a network device (e.g., eNB 101 shown in FIG. 1) or a terminal device (e.g., the UE 102 shown in FIG. 1). For ease of discussions, the method 700 will be described below with reference to the network device 101 and the environment as described with reference to FIG. 1.

The method 700 may be considered as a specific implementation of the method 600. As shown in FIG. 7A, at block 710, the network device 101 obtains information on analog BF scheduling result or decision, for example information on which beam is selected for which time and/or frequency resource. The information on beam selection may be obtained from a scheduler unit or a baseband unit of the network device 101. In an embodiment where BF sweeping is implemented at the network device 101 side, the beam selection may be defined as grids (due to time sweeping) for AGC scheduling. The analog BF (e.g. for regular data/control reception) outside of the beam-sweeping context may be set/scheduled via a command from the scheduling unit or the baseband unit of the network device 101.

The scheduling decision obtained at block 710 is utilized by the network device 101 at block 720 for AGC scheduling. The AGC scheduling may be implemented to synchronize the AGC radio related operation to the analog BF operation. An embodiment described with reference to block 620 of FIGS. 6A-6C may be performed by the network device 101 at block 720 for the AGC scheduling. For instance, the AGC scheduling may make use of information on a predetermined mapping between AGC value(s) and beam(s) (or BF parameter(s)). In an embodiment, the AGC scheduling may also make use of scheduling information of a transmitting device. One or more of the predetermined mapping and the scheduling information of the transmitting device may be obtained at block 750. In an embodiment, a status of the AGC associated with a beam selected by the scheduling unit may be known in advance and so stored. The storage of such information can be done, for example, with a mapping or table which relates an AGC gain to a respective beam parameter (e.g., an index, a weight, a vector or matrix of a beam). The AGC gains can also be related jointly to both a beam parameter and information of a transmitter (e.g., served user).

At block 730, the network device 101 performs the AGC operation according to a result of the AGC scheduling. As shown in FIG. 7A, the AGC scheduling becomes the precondition of AGC operations. In an embodiment, the AGC scheduling may indicate which AGC gain should be applied in which time and/or frequency resource. In another embodiment, the AGC scheduling may indicate a set of AGC gain values to be applied for a set of time and/or frequency resource or a given range of time (and/or frequency) resources. As an example, an AGC scheduling command may be sent from an AGC scheduling unit to an AGC operation unit of the network device 101 in a format of a table. Since the AGC scheduling unit obtaining the beamforming/scheduling decision and prior AGC status information will be able to send the AGC scheduling command to the AGC operation unit prior to actual time of need, it leaves time for the AGC operation unit to adjust/set the AGC gain value and mitigate the gain change hysteresis.

The BF scheduling decision/command may be sent or transferred to both the AGC scheduling unit and an analog BF operating unit. At block 730, the AGC operation may be performed synchronously with the analog BF operation which is performed at block 740 based on the BF scheduling decision obtained at block 710. The synchronous operation of the AGC and the analog BF may be implemented based on a time point indicated in the scheduling decision/command, or based on further coordination, for example between the AGC operation unit and the analog BF unit.

In an embodiment, the method 700 may include a block 760 for updating the predetermined mapping between the AGC value and the beam (or BF parameters). As an example, at block 760, the network device 101 may perform an operation described with reference to block 642 of FIG. 6D. In an embodiment, after each AGC operation, an AGC status for a beam index is obtained and a relationship between the AGC status and the beam may be used as a basis for AGC scheduling of next turn. Such an operation is illustrated in FIG. 7A by the line 770. In another embodiment, when a terminal device performs a beam change (intra-cell or inter-cell), the network device 101 can also trigger a modification of an associated AGC value for both beams concerned (i.e., previous beam and new beam of the terminal). The AGC values associated with the concerned beams in a predetermined mapping (which may be stored for example in a table) can be either kept unchanged, or reset to predefined/default values. In another embodiment, an AGC value associated with the previous beam of the terminal may be reused for the new beam (or destination beam) of the terminal.

As shown in the flowchart of method 700 in FIG. 7A, compared with a conventional AGC mechanism and analog BF control flows, a new control flow, which may be called an AGC scheduling flow in this disclosure, is added and is shown as block 720 in FIG. 7A. The new AGC scheduling block is to make the selection/adjustment of the AGC gain pro-active rather than reactive. In this way, by sending/outputting a gain control command from the AGC scheduling block 720 to the AGC operation block 730 early enough based on a prediction on AGC value needed, the network device 101 can anticipate and set the AGC gain to a proper value in time.

In an embodiment, method 700 may be used to determine AGC gain for each beam separately, with a possibility of having parallel (independent) instances or processes for managing each beam. The processes may be arranged in time domain and may be periodical or non-periodical.

In another embodiment, the network device 101 may have multiple RF chains with analog BF (sometimes referred to as Hybrid). In this case, multiple parallel RF chains may exist in the network device 101. Traditionally, each of the AGC blocks for the multiple RF chains is independent for each other. That is, in an embodiment, the method 700 may be applied for controlling AGC operation for each RF chain independently.

Alternatively, in another embodiment, with information about which beam/user uses which AGC gain (e.g., from scheduling information of the user, and predetermined mapping between beams and AGC gains), the network device 101 may jointly schedule multiple beams to the multiple RF chains, such that beams associated with a same AGC value may be applied in a contiguous time interval for a RF chain. This way, change to the AGC gain value may be minimized and state transitions of the AGC and performance degradation may be reduced. In this case, at block 710, the network device may obtain information on joint scheduling of multiple beams.

In still another embodiment, the network device 101 may allow different AGC qualities on different RF branches. For example, the network device 101 may schedule beams/users associated with similar AGC gains on a RF chain with slowly changing AGC loop (which can be cheaper and may use a conventional AGC mechanism as shown in FIG. 3), and use a RF chain with faster or more accurate AGC loops (which may be more expensive and may use any of the AGC mechanisms proposed herein) to adapt to wider changes or uncertain AGC values. That is, an embodiment of the method 600 or 700 may be applied to some of the RF chains of the network device 101, while a conventional AGC mechanism may be used for other of the RF chains of the network device.

Figure 7B:
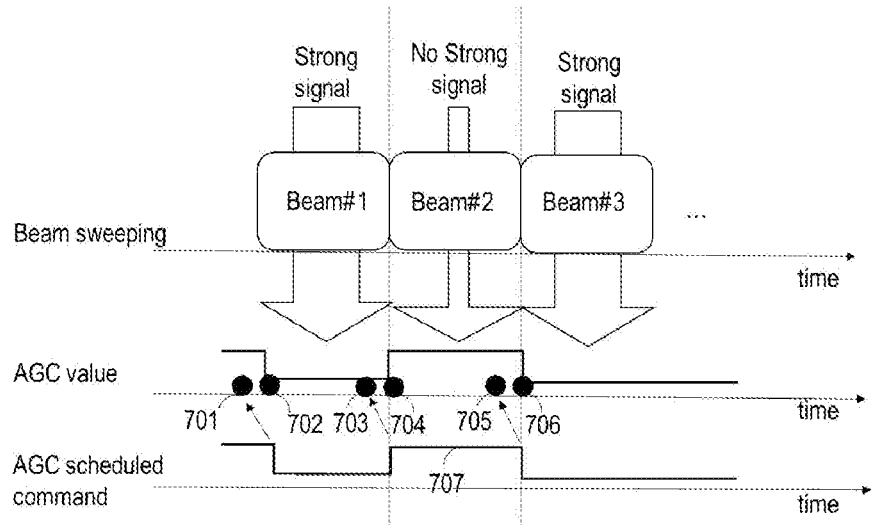
FIG. 7B schematically illustrates a result of AGC control according to an embodiment of the present disclosure.

FIG. 7B schematically illustrates a result of AGC control according to an embodiment of the present disclosure. As shown in FIG. 7B, a receiving device (e.g., the network device 101 or terminal device 102 shown in FIG. 1) is able to obtain scheduling information of Beam#1 before the Beam#1 is applied at 702, and as a result, the receiving device can schedule the AGC operation in accordance with the BF scheduling in advance at 701 such that a proper AGC gain value is applied in a time duration between 702 and 704 where the Beam#1 is applied. AGC operations for Beam#2 and Beam #3 are scheduled in a similar way at 703 and 705 respectively before Beam#2 and Beam#3 are applied at 704 and 706. In this way, mismatch between the BF (and correspondingly receiving signal power) and the AGC gain can be avoided.

Figure 8:
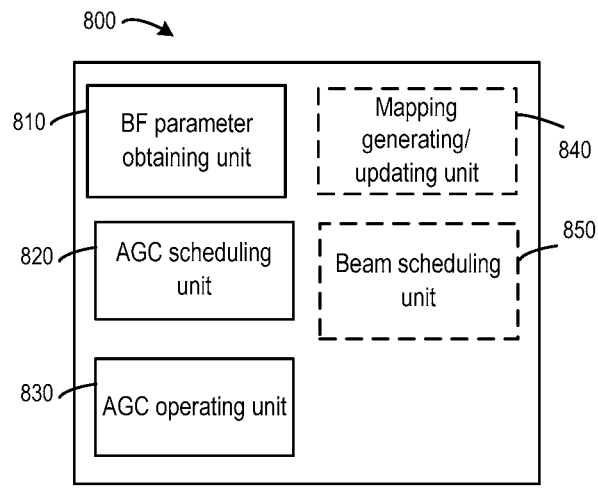
FIG. 8 illustrates a schematic block diagram of an apparatus implemented as/in a receiving device according to an embodiment of the present disclosure.

FIG. 8 illustrates a schematic block diagram of an apparatus 800 in a wireless communication network (e.g., the wireless communication network 100 shown in FIG. 1). The apparatus may be implemented as/in a network device (e.g., the network device 101) or a terminal device (e.g., UE 102) shown in FIG. 1. The apparatus 800 is operable to carry out the example method 600 or 700 described with reference to FIGS. 6A-6E, 7 and possibly any other processes or methods. It is also to be understood that the method 600 or 700 is not necessarily carried out by the apparatus 800. At least some steps of the method 600 or 700 can be performed by one or more other entities.

As illustrated in FIG. 8, the apparatus 800 includes a BF parameter obtaining unit 810, an AGC scheduling unit 820, and an AGC operating unit 830. The BF parameter obtaining unit 810 is configured to obtain a BF parameter associated with a signal to be received, the AGC scheduling unit 820 is configured to schedule an AGC operation based on the BF parameter, and the AGC operating unit 830 is configured to apply the AGC operation on the signal according to the scheduling.

In an embodiment, the AGC scheduling unit 820 may be configured to schedule the AGC operation by performing operations described with reference to block 620-624 of method 600, and therefore, descriptions provided with reference to block 620-624 of method 600 also apply here and details will not be repeated.

In an embodiment, the AGC operating unit 830 may be configured to apply the AGC operation synchronously with application of the BF parameter on the signal.

In another embodiment, the apparatus 800 may further include a mapping generating/updating unit 840 which may be configured to generate the predetermined mapping between a BF parameter and an AGC gain, for example, based on historical/previous value(s) of AGC gain associated with the BF parameter, and/or update the predetermined mapping based on one or more of: a measurement on receiving power of the signal, scheduling information related to a beam, scheduling information related to a transmitter, and mobility of a transmitter. In an embodiment, the mapping generating/updating unit 840 may be configured to generating/updating the predetermined mapping by performing operations described with reference to block 640-642 of method 600, and therefore, descriptions provided with reference to block 640-642 of method 600 also apply here and details will not be repeated.

In another embodiment, the apparatus 800 may further include a beam scheduling unit 850 configured to schedule a receiving beam. For example, the beam scheduling unit 850 may be configured to schedule the beam by performing operations described with reference to block 650-652 of method 600, and therefore, descriptions provided with reference to block 650-652 of method 600 also apply here and details will not be repeated.

Figure 9:
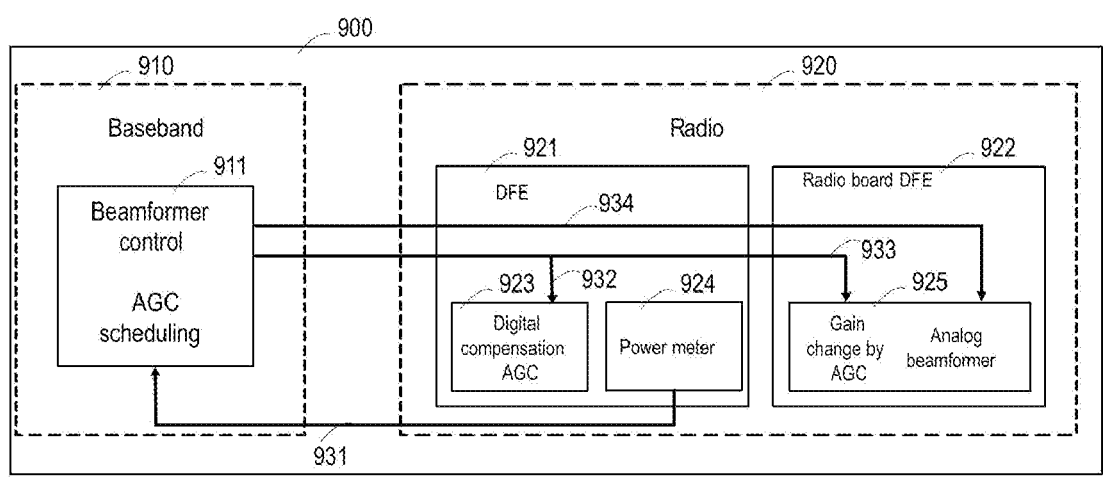
FIG. 9 illustrates a schematic block diagram of receiving device according to an embodiment of the present disclosure.

FIG. 9 illustrates a block diagram of an example receiving device 900 according to an embodiment of the present disclosure. The receiving device 900 may be, for example, a network device (e.g., the network device 101) or a terminal device (e.g., UE 102) shown in FIG. 1.

As shown in FIG. 9, the receiving device 900 includes a baseband unit 910 for baseband processing and a radio unit 920 for radio frequency processing. From functionality point of view, the baseband unit 910 handles BF control and AGC scheduling, and the AGC scheduling is based on BF control information. After synchronization between the BF scheduling and AGC scheduling, the AGC scheduling controls analog AGC gain and AGC digital compensation while the BF scheduling controls BF. In particular, in this example, the baseband unit 910 may include a baseband controlling unit 911 which is configured for BF control and AGC scheduling. That is, the baseband controlling unit 911 may perform operations described with reference to block 620, 650 of method 600 or block 720, 710 of method 700, or a part thereof. It should be appreciated that BF control and AGC scheduling may be performed by two or more separate units in another embodiment.

The radio unit 920 includes a digital frontend (DFE) unit 921 and a radio board DFE unit 922. The baseband controlling unit 911 may provide an input to the DFE unit 921 and the radio board DFE unit 922. In particular, the baseband controlling unit 911 may provide an input 932 to a digital compensation AGC unit 923 within the DFE unit 921 and an input 933 to an analog control unit 925 for analog AGC control. The baseband controlling unit 911 may also provide an input 934 to an analog control unit 925 for analog BF. In an embodiment, the digital compensation AGC unit 923 and the analog control unit 925 may perform operations described with reference to block 630 of method 600 and block 730 of block 700, or a part thereof.

As shown in FIG. 9, the digital frontend unit 921 may also include a power meter 924 which may be configured to measure received signals and provide feedback 931 to the baseband controlling unit 911 for AGC scheduling, and/or, generating/updating a predetermined mapping between a BF parameter and an AGC gain. The power meter 924 may also provide an input (not shown in FIG. 9) to the digital compensation AGC unit 923 to facilitate a conventional AGC operation and/or to refine AGC control, as described with reference to method 600. In an embodiment, the signaling 931-934 may be transmitted via a CPRI link, but embodiments are not limited thereto.

Figure 10:
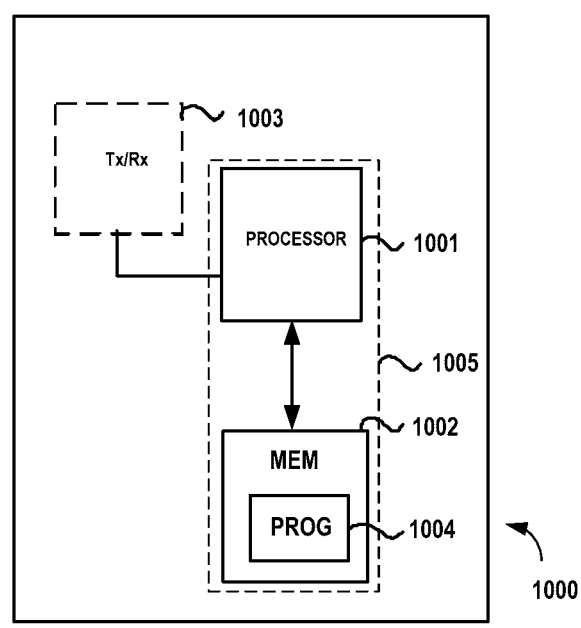
FIG. 10 illustrates a simplified block diagram of an apparatus that may be embodied as/in a network device or a terminal device.

FIG. 10 illustrates a block diagram of an apparatus 1000 that may be embodied in/as a network device, e.g., the network device 101 shown in FIG. 1, or a terminal device, e.g., one of the terminal devices 102 shown in FIG. 1.

The apparatus 1000 may include one or more processors 1001, such as a data processor (DP) and one or more memories (MEM) 1002 coupled to the processor 1001. The apparatus 1000 may further include a transmitter TX and receiver RX 1003 coupled to the processor 1001. The MEM 1002 may be non-transitory machine readable storage medium and it may store a program (PROG) 1004. The PROG 1004 may include instructions that, when executed on the associated processor 1001, enable the apparatus 1000 to operate in accordance with the embodiments of the present disclosure, for example to perform the method 600 or 700. A combination of the one or more processors 1001 and the one or more MEMs 1002 may form processing means 1005 adapted to implement various embodiments of the present disclosure.

Various embodiments of the present disclosure may be implemented by computer program executable by one or more of the processors 1001, software, firmware, hardware or in a combination thereof.

The MEM 1002 may be of any type suitable to the local technical environment and may be implemented using any suitable data storage technology, such as semiconductor based memory terminal devices, magnetic memory terminal devices and systems, optical memory terminal devices and systems, fixed memory and removable memory, as non-limiting examples.

The processor 1001 may be of any type suitable to the local technical environment, and may include one or more of general purpose computers, special purpose computers, microprocessors, digital signal processors DSPs and processors based on multicore processor architecture, as non-limiting examples.

Although some of the above description is made in the context of a wireless system operating in a shared frequency band (e.g., an unlicensed band), it should not be construed as limiting the spirit and scope of the present disclosure. The principle and concept of the present disclosure may be more generally applicable to other scenarios.

In addition, the present disclosure may also provide a memory containing the computer program as mentioned above, which includes machine-readable media and machine-readable transmission media. The machine-readable media may also be called computer-readable media, and may include machine-readable storage media, for example, magnetic disks, magnetic tape, optical disks, phase change memory, or an electronic memory terminal device like a random access memory (RAM), read only memory (ROM), flash memory devices, CD-ROM, DVD, Blue-ray disc and the like. The machine-readable transmission media may also be called a carrier, and may include, for example, electrical, optical, radio, acoustical or other form of propagated signals—such as carrier waves, infrared signals, and the like.

The techniques described herein may be implemented by various means so that an apparatus implementing one or more functions of a corresponding apparatus described with an embodiment includes not only prior art means, but also means for implementing the one or more functions of the corresponding apparatus described with the embodiment and it may include separate means for each separate function, or means that may be configured to perform two or more functions. For example, these techniques may be implemented in hardware (one or more apparatuses), firmware (one or more apparatuses), software (one or more modules), or combinations thereof. For a firmware or software, implementation may be made through modules (e.g., procedures, functions, and so on) that perform the functions described herein.

Example embodiments herein have been described above with reference to block diagrams and flowchart illustrations of methods and apparatuses. It will be understood that each block of the block diagrams and flowchart illustrations, and combinations of blocks in the block diagrams and flowchart illustrations, respectively, can be implemented by various means including hardware, software, firmware, and a combination thereof. For example, in one embodiment, each block of the block diagrams and flowchart illustrations, and combinations of blocks in the block diagrams and flowchart illustrations can be implemented by computer program instructions. These computer program instructions may be loaded onto a general purpose computer, special purpose computer, or other programmable data processing apparatus to produce a machine, such that the instructions which execute on the computer or other programmable data processing apparatus create means for implementing the functions specified in the flowchart block or blocks.

Further, while operations are depicted in a particular order, this should not be understood as requiring that such operations be performed in the particular order shown or in sequential order, or that all illustrated operations be performed, to achieve desirable results. In certain circumstances, multitasking and parallel processing may be advantageous. Likewise, while several specific implementation details are contained in the above discussions, these should not be construed as limitations on the scope of the subject matter described herein, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

It will be obvious to a person skilled in the art that, as the technology advances, the inventive concept can be implemented in various ways. The above described embodiments are given for describing rather than limiting the disclosure, and it is to be understood that modifications and variations may be resorted to without departing from the spirit and scope of the disclosure as those skilled in the art readily understand. Such modifications and variations are considered to be within the scope of the disclosure and the appended claims. The protection scope of the disclosure is defined by the accompanying claims.

What is claimed is:

1. A method performed by a receiving device, the method comprising:
    using a first receive (RX) beam to receive a first signal;
    obtaining a parameter associated with a second receive (RX) beam that is different from the first receive beam prior to receiving a second signal;
    adjusting a gain based on the obtained parameter associated with the second RX beam, wherein adjusting the gain based on the obtained parameter associated with the second RX beam comprises: i) specifying, based on the obtained parameter associated with the second RX beam, a certain time at which to perform a gain control operation and ii) adjusting the gain at the specified time;
    switching from the first receive beam to the second receive beam;
    after switching from the first receive beam to the second receive beam, using the second receive beam to receive the second signal; and
    applying the adjusted gain to the second signal.

2. The method of claim 1, further comprising:
    predicting a received power of the second signal based on the parameter; and
    adjusting the gain based on the predicted received power.

3. The method of claim 1, further comprising:
    switching back to the first receive beam to receive a third signal;
    obtaining another parameter associated with the second receive beam prior to receiving a fourth signal;
    changing the gain based on said another parameter associated with the second receive beam;
    switching from the first receive beam to the second receive beam;
    after switching from the first receive beam to the second receive beam, using the second receive beam to receive the fourth signal; and
    applying the changed gain to the fourth signal.

4. The method of claim 1, wherein adjusting the gain based on the parameter comprises:
    adjusting the gain based on a predetermined mapping between the parameter and the gain.

5. The method of claim 4, further comprising:
    generating the predetermined mapping between the parameter and the gain based on a historical value of a gain associated with the parameter.

6. The method of claim 4, further comprising:
    updating the predetermined mapping between the parameter and the gain based on one or more of:
        a measurement on receiving power of the second signal,
        scheduling information related to the second receive beam,
        scheduling information related to a transmitter, and
        mobility of the transmitter.

7. The method of claim 4, wherein, in the predetermined mapping, the gain is a function of the parameter and information related to a transmitter.

8. The method of claim 1, further comprising:
    scheduling a plurality of receive beams associated with a gain in a plurality of contiguous time intervals respectively.

9. The method of claim 1, wherein applying the adjusted gain to the second signal comprises:
    applying the adjusted gain synchronously with application of the parameter.

10. The method of claim 1, wherein the receiving device includes a plurality of radio frequency (RF) chains, and the method further comprises:
    scheduling a plurality of receive beams for the plurality of RF chains jointly.

11. The method of claim 1, wherein the parameter comprises one or more of:
    an index of the second receive beam,
    a beamforming weight associated with the second receive beam, and
    beamforming gain associated with the second receive beam.

12. An apparatus, the apparatus comprising a processor and a memory, said memory containing instructions executable by said processor, wherein said apparatus is operative to:
    use a first receive (RX) beam to receive a first signal;
    obtain a parameter associated with a second receive (RX) beam that is different from the first receive beam prior to receiving a second signal;
    adjust a gain based on the obtained parameter associated with the second RX beam, wherein the apparatus is configured to adjust the gain by i) specifying, based on the obtained parameter associated with the second RX beam, a certain time at which to perform a gain control operation and ii) adjusting the gain at the specified time;
    switch from the first receive beam to the second receive beam;
    after switching from the first receive beam to the second receive beam, use the second receive beam to receive the second signal; and
    apply the adjusted gain to the second signal.

13. The apparatus of claim 12, wherein said memory contains instructions executable by said processor whereby said apparatus is further operative to:
    obtain a predicted receiving power of the second signal based on the parameter; and
    adjust the gain based on the predicted receiving power.

14. The apparatus of claim 12, wherein said memory contains instructions executable by said processor whereby said apparatus is further operative to:
  switch back to the first receive beam to receive a third signal;
  obtain a parameter associated with the second receive beam prior to receiving a fourth signal;
  change the gain based on the parameter;
  switch from the first receive beam to the second receive beam;
  after switching from the first receive beam to the second receive beam, use the second receive beam to receive the fourth signal; and
  apply the changed gain to the fourth signal.

15. The apparatus of claim 14, wherein said memory contains instructions executable by said processor whereby said apparatus is further operative to adjust the gain based on the parameter by:
  adjusting the gain based on a predetermined mapping between the parameter and the gain.

16. The apparatus of claim 15, wherein said memory contains instructions executable by said processor whereby said apparatus is further operative to:
  generate the predetermined mapping between the parameter and the gain based on a historical value of a gain associated with the parameter.

17. The apparatus of claim 15, wherein said memory contains instructions executable by said processor whereby said apparatus is further operative to:
  update the predetermined mapping between the parameter and the gain based on one or more of:
    a measurement on receiving power of the second signal,
    scheduling information related to the second receive beam,
    scheduling information related to a transmitter, and
    mobility of the transmitter.

18. The apparatus of claim 15, wherein, in the predetermined mapping, the gain is a function of the parameter and information related to a transmitter.

19. The apparatus of claim 12, wherein said memory contains instructions executable by said processor whereby said apparatus is further operative to schedule a plurality of receive beams associated with a gain in a plurality of contiguous time intervals respectively.

20. The apparatus of claim 12, wherein said memory contains instructions executable by said processor whereby said apparatus is further operative to apply the adjusted gain to the second signal by:
  applying the adjusted gain synchronously with application of the parameter.

21. The apparatus of claim 12, wherein the apparatus further comprises a plurality of radio frequency (RF) chains, and said memory contains instructions executable by said processor whereby said apparatus is further operative to:
  schedule a plurality of receive beams for the plurality of RF chains jointly.

22. The apparatus of claim 12, wherein the parameter comprises one or more of:
  an index of the second receive beam,
  a beamforming weight associated with the second receive beam, and
  beamforming gain associated with the second receive beam.

23. An apparatus, the apparatus comprising a data processing apparatus comprising one or more processors, wherein the data processing apparatus is adapted to:
  use a first receive (RX) beam to receive a first signal;
  obtain a parameter associated with a second receive (RX) beam that is different from the first receive beam prior to receiving a second signal;
  adjust a gain based on the obtained parameter associated with the second RX beam, wherein the data processing apparatus is configured to adjust the gain by i) specifying, based on the obtained parameter associated with the second RX beam, a certain time at which to perform a gain control operation and ii) adjusting the gain at the specified time;
  switch from the first receive beam to the second receive beam;
  after switching from the first receive beam to the second receive beam, use the second receive beam to receive the second signal; and
  apply the adjusted gain to the second signal.

24. The apparatus of claim 12, further comprising a transmitter and a receiver.

25. A non-transitory computer readable storage medium storing a computer program, comprising instructions which, when executed on at least one processor, cause the at least one processor to carry out the method of claim 1.

* * * * *